(12) United States Patent
Kishiro

(10) Patent No.: US 9,664,719 B2
(45) Date of Patent: May 30, 2017

(54) CAPACITANCE DETECTION CIRCUIT

(71) Applicant: FUJI ELECTRIC CO., LTD., Kawasaki-shi (JP)

(72) Inventor: Masami Kishiro, Hino (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 392 days.

(21) Appl. No.: 14/350,808

(22) PCT Filed: Nov. 19, 2012

(86) PCT No.: PCT/JP2012/007407
§ 371 (c)(1),
(2) Date: Apr. 9, 2014

(87) PCT Pub. No.: WO2013/076954
PCT Pub. Date: May 30, 2013

(65) Prior Publication Data
US 2014/0300375 A1    Oct. 9, 2014

(30) Foreign Application Priority Data

Nov. 22, 2011 (JP) .................................. 2011-255331

(51) Int. Cl.
G01R 27/26    (2006.01)
G01P 15/00    (2006.01)
(Continued)

(52) U.S. Cl.
CPC ....... *G01R 27/2605* (2013.01); *G01D 5/2417* (2013.01); *G01P 15/00* (2013.01);
(Continued)

(58) Field of Classification Search
CPC ............... H05K 1/0256; H05K 3/3452; H05K 2201/09972; H05K 2201/10151;
(Continued)

(56) References Cited

U.S. PATENT DOCUMENTS 4,644,798 A      2/1987   Tamura et al.
5,402,075 A *    3/1995   Lu ............................ G01R 1/07
                                                               324/664
(Continued)

FOREIGN PATENT DOCUMENTS

JP     S61-65114 A     4/1986
JP     S62-252953 A    11/1987
(Continued)

OTHER PUBLICATIONS

Extended European Search Report dated Nov. 26, 2015.

*Primary Examiner* — Jermele M Hollington
*Assistant Examiner* — Suresh K Rajaputra
(74) *Attorney, Agent, or Firm* — Rabin & Berdo, P.C.

(57) ABSTRACT

A capacitance detection circuit has at least a carrier signal generating circuit that supplies a carrier signal to one of a movable or a fixed electrode of a sensor, an operational amplifier with one of the movable or fixed electrode as an input and ground as another input, and a printed circuit board on which the physical quantity sensor, the carrier signal generating circuit, and the operational amplifier are mounted. An insulation-secured area on the printed circuit board is configured as a moisture absorption reduction area, including at least an electrode connection part of the physical quantity sensor, an input-side connection part of the operational amplifier, and a connection part connected to the input side of the operational amplifier out of connection parts of input-side circuit components connected between the electrode connection part and the input-side connection part.

15 Claims, 17 Drawing Sheets

(51) Int. Cl.
*H05K 1/02* (2006.01)
*G01D 5/241* (2006.01)
*G01P 15/125* (2006.01)
*H05K 3/34* (2006.01)
*G01P 15/08* (2006.01)

(52) U.S. Cl.
CPC .......... *G01P 15/125* (2013.01); *H05K 1/0256* (2013.01); *G01P 2015/082* (2013.01); *G01P 2015/084* (2013.01); *H05K 3/3452* (2013.01); *H05K 2201/09972* (2013.01); *H05K 2201/10151* (2013.01)

(58) Field of Classification Search
CPC ......... G01P 2015/082; G01P 2015/084; G01P 15/125; G01P 15/00; G01D 5/2417; G01R 27/2605
See application file for complete search history.

(56) References Cited

U.S. PATENT DOCUMENTS

| | | | |
|---|---|---|---|
| 6,422,078 B2* | 7/2002 | Imai | G01C 19/56 73/514.32 |
| 7,432,724 B2* | 10/2008 | Goto | G01R 27/2605 324/658 |
| 8,372,677 B2* | 2/2013 | Mehregany | B81C 1/00182 438/51 |
| 2002/0139573 A1* | 10/2002 | Gehrke | G01D 3/08 174/256 |
| 2005/0016273 A1* | 1/2005 | Murata | G01P 15/131 73/514.32 |
| 2006/0033429 A1 | 2/2006 | Fujimura et al. | |
| 2008/0128901 A1* | 6/2008 | Zurcher | B81C 1/00238 257/724 |
| 2009/0095080 A1* | 4/2009 | Sasaki | G01D 5/24 73/514.32 |
| 2010/0127715 A1* | 5/2010 | Jeong | G01C 19/5719 324/661 |
| 2011/0100126 A1* | 5/2011 | Jeong | G01C 19/5719 73/514.32 |

FOREIGN PATENT DOCUMENTS

| | | |
|---|---|---|
| JP | H10-173296 A | 6/1998 |
| JP | 2000-234939 A | 8/2000 |
| JP | 2002-064947 A | 2/2002 |
| JP | 2002-256060 A | 9/2002 |
| JP | 2003-098660 A | 4/2003 |
| JP | 2006-054111 A | 2/2006 |
| JP | 2008-102091 A | 5/2008 |

* cited by examiner

CAPACITANCE DETECTION CIRCUIT

TECHNICAL FIELD

The present invention relates to a capacitance detection circuit for detecting a capacitance between a movable electrode and a fixed electrode of a physical quantity sensor, with these movable and fixed electrodes generating a change in capacitance in response to a change in physical quantity.

BACKGROUND ART

An acceleration sensor, a gyroscope, a displacement sensor, a pressure sensor, or other type of physical quantity sensor for detecting a physical quantity change as a capacitance change, is required to ensure insulation resistance and reduce circuit noise when a capacitance detection circuit thereof needs to have a high resolution or when a MEMS (Micro Electro Mechanical System) sensor needs to be combined with the capacitance detection circuit in order to achieve cost/size reduction.

The prior art of Patent Document 1 (identified further on), therefore, describes a method for manufacturing a printed circuit board, which does not require a solder resist with a hygroscopic solder mask and prevents solder from flowing in a component mounting section, by implanting a metal conductor layer into a surface of an insulating substrate containing at least an organic resin, and then etching a surface of the metal conductor layer onto which, for example, a terminal of an electronic component is soldered, to form a concave portion that is 0.5 to 30 μm deep from the surface of the insulating substrate.

Furthermore, in order to provide a resist ink composition in which deterioration of the electrical characteristics such as insulation resistances does not occur even under high humidity, and to provide a printed wiring board having a cured film of the resist ink composition, the prior art described in Patent Document 2 (identified further on) suggests a printed wiring board that has a solder-resist ink plastic substance and a film for covering the solder resist ink composition, the solder-resist ink composition containing a colorant, hardening resin, reactive diluent, polymerization initiator, and filler.

Patent Document 1: Japanese Patent Application Publication No. H10-173296

Patent Document 2: Japanese Patent Application Publication No. 2003-98660

However, the problem pertaining to the prior art described in Patent Document 1 is that the structure of the printed circuit board is complicated because the surface of the metal conductor layer, implanted into the surface of the insulating substrate and having a terminal of an electronic component soldered thereto, is etched into a concave that is 0.5 to 30 μm deep from the surface of the insulating substrate.

The problem pertaining to the prior art described in Patent Document 2 is that solder-resist ink with a special composition needs to be used, which increases the production cost.

SUMMARY

The present invention was contrived in view of these unsolved problems of the prior art described in Patent Documents 1 and 2, and an object of the present invention is to provide a capacitance detection circuit having a simple structure, which is capable of preventing an insulation resistance from being lowered by deterioration of hygroscopy and preventing an increase of noise.

In order to achieve the object, the present invention provides a capacitance detection circuit for detecting a small capacitance between a movable electrode and a fixed electrode in a physical quantity sensor, with the movable electrode and fixed electrode generating a change in capacitance in response to a change in physical quantity, the capacitance detection circuit comprising, at least: a bias voltage generating circuit that generates a bias voltage to be supplied to one of the movable and fixed electrodes; an operational amplifier that has input terminals, with the other one of the movable and fixed electrodes being input to one of the input terminals and the other one of the terminals being connected to the ground; and a printed circuit board on which the physical quantity sensor, the bias voltage generating circuit, and the operational amplifier are mounted, wherein an insulation-secured area on the printed circuit board is configured as a moisture absorption reduction area, the insulation-secured area including at least an electrode connection pad of the physical quantity sensor, an input-side connection pad of the operational amplifier, and a connection pads connected to an input side of the operational amplifier, out of connection pads of input-side circuit components connected between the electrode connection pad and the input-side connection pad.

In a second aspect of the capacitance detection circuit according to the present invention, the input-side circuit components include a resistor and a capacitor connected between an output terminal of the operational amplifier and one of the input terminals thereof.

A third aspect of the capacitance detection circuit according to the present invention is a capacitance detection circuit for detecting a pair of small capacitances between a pair of electrode parts of a physical quantity sensor having a differential structure, each of the pair of electrode parts being configured by a movable electrode and a fixed electrode generating a change in capacitance in response to a change in physical quantity. The capacitance detection circuit has at least: a bias voltage generating circuit that generates a bias voltage to be supplied to one of the movable and fixed electrodes of each of the pair of electrode parts; an operational amplifier that has input terminals and amplifies a difference between the pair of small capacitances, with the other one of the movable and fixed electrodes of each of the pair of electrode parts being input to one of the input terminals; and a printed circuit board on which the physical quantity sensor, the bias voltage generating circuit, and the operational amplifier are mounted, wherein an insulation-secured area on the printed circuit board is configured as a moisture absorption reduction area, including a pair of electrode connection parts of each of the pair of electrode parts that are connected to the operational amplifier, input-side connection parts of the operational amplifier, and connection parts connected to the input-side connection parts of the operational amplifier, out of connection parts of input-side circuit components connected between the electrode connection parts and the input-side connection parts.

In a fourth aspect of the capacitance detection circuit according to the present invention, the input-side circuit components include a parallel circuit configured by a first capacitor and a first resistor connected between the ground and a connection of one of the paired electrode parts and one of the input terminals of the operational amplifier, and a second capacitor connected between the ground and a connection of the other one of the paired electrode parts and the other one of the input terminals of the operational amplifier, and a parallel circuit configured by a third capacitor and a second resistor connected between an output terminal of the operational amplifier and the other one of the input terminals thereof.

In a fifth aspect of the capacitance detection circuit according to the present invention, the moisture absorption reduction area forms a resist-applied area that is applied with a resist to cover the insulation-secured area, and a band-like separation area that surrounds the insulation-secured area in such a manner as to separate the resist-applied area from a resist-applied area therearound, the band-like separation area being configured as a non-resist-applied area and as a non-silk-printing area.

In a sixth aspect of the capacitance detection circuit according to the present invention, the moisture absorption reduction area forms the entire surface of the insulation-secured area as a non-resist-applied area and a non-silk-printing area.

In a seventh aspect of the capacitance detection circuit according to the present invention, the bias voltage generating circuit generates a carrier signal having an AC waveform such as a sine wave or square wave.

In an eighth aspect of the capacitance detection circuit according to the present invention, the bias voltage generating circuit is configured to generate a DC bias voltage.

According to the present invention, the insulation-secured area is configured as the moisture absorption reduction area, the insulation-secured area including the electrode connection part of the physical quantity sensor and the input-side connection part of the operational amplifier, which are placed on the printed circuit board having the physical quantity sensor, the operational amplifier and the like, and the connection part connected to the input-side connection part of each input-side circuit component connected between the electrode connection part and the input-side connection part. The moisture absorption reduction area is configured as a non-resist-applied area, a non-screen-printing area, or a resist area independent from the other areas.

Deterioration of an insulation resistance caused due to moisture absorption can reliably be prevented by configuring the insulation-secured area as the moisture absorption reduction area as described above, the insulation-secured area including the connection parts of the input-side circuit components provided on the input side of the operational amplifier on the printed circuit board. This prevents the occurrence of insulation resistance deterioration and an increase in noise and enables easy detection of a small capacitance value using an inexpensive structure, without requiring the printed circuit board to be kept airproof.

In addition, configuring the moisture absorption reduction area as a resist area independent from other areas can protect a wiring pattern from rusting while reducing moisture absorption.

BRIEF DESCRIPTION OF THE DRAWINGS

FIG. 1 is a schematic diagram showing an acceleration sensor according to a first embodiment of the present invention without an upper substrate, wherein

DETAILED DESCRIPTION

An embodiment of the present invention is described hereinafter with reference to the drawings.

Figure 1A:
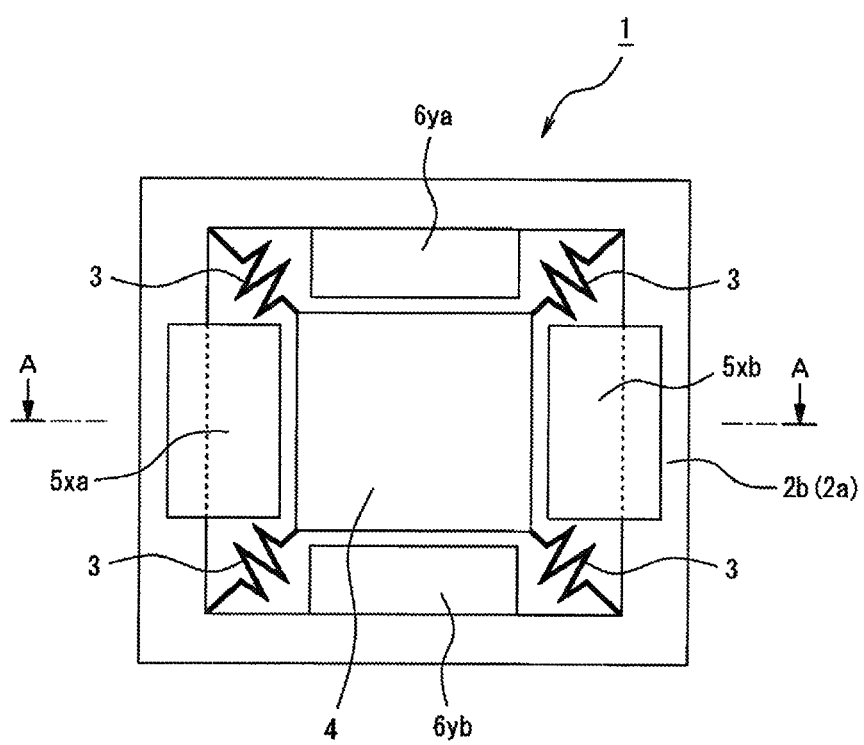
FIG. 1A is a plan view without an upper part substrate and FIG. 1B is a cross-sectional diagram taken along the line A-A of FIG. 1A.
Figure 1B:
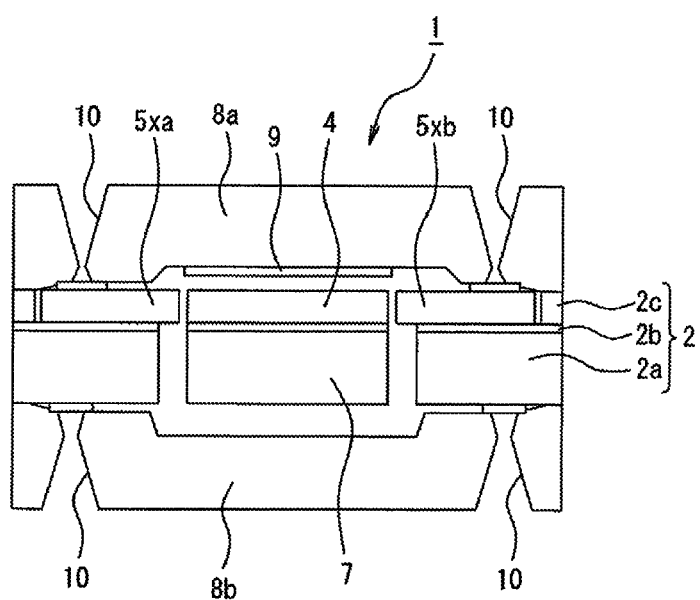

FIGS. 1A and 1B are schematic diagrams showing an example of an acceleration sensor to which a capacitance detection circuit according to the present invention can be applied. FIG. 1A is a plan view showing the acceleration sensor without an upper substrate. FIG. 1B is a cross-sectional diagram taken along the line A-A of FIG. 1A.

In the diagram, reference numeral 1 represents an acceleration sensor as a physical quantity sensor. This acceleration sensor 1 is configured by an SOI (Silicon On Insulator) substrate 2. The SOI substrate 2 is configured by a silicon support layer 2a forming an underlayer of the SOI substrate 2, an oxide silicon layer 2b formed on the silicon support layer 2a, and a silicon active layer 2c formed on the oxide silicon layer 2b.

The silicon support layer 2a and the oxide silicon layer 2b have a weight 7, described hereinafter, which has its outer circumferential portion formed into a square frame and its central portion dry-etched into a square groove.

The silicon active layer 2c has at its center a square movable electrode 4 that is supported at its corners on the oxide silicon layer 2b by spring materials 3, a pair of X-axis fixed electrodes 5xa, 5xb fixed to the oxide silicon layer 2b in such a manner as to face the two sides of the movable electrode 4 that extend in an X-direction, and a pair of Y-axis fixed electrodes 6ya, 6yb fixed to the oxide silicon layer 2b in such a manner as to face the two sides of the movable electrode 4 that extend in a Y-direction. On the upper surface of the movable electrode, the weight 7 is provided.

Furthermore, the upper and lower sides of the SOI substrate 2 are covered with glass substrates 8a and 8b respectively. A Z-axis fixed electrode 9 is formed on the glass substrate 8a in such a manner as to face the movable electrode 4. Through-holes 10 are formed in these glass substrates 8a and 8b in order to extract signals of the X-axis fixed electrodes 5Xa, 5Xb, the Y-axis fixed electrodes 6Ya, 6Yb, the movable electrode 4, and the Z-axis fixed electrode 9 to the outside.

In X direction of the acceleration sensor 1, therefore, capacitances Cxa and Cxb between the movable electrode 4 and the pair of left and right fixed electrodes 5xa and 5xb form a differential structure having a horizontally symmetric correlation where one of the capacitances increases while the other decreases. Similarly, in the Y direction, capacitances Cya and Cyb between the movable electrode 4 and the pair of front and rear fixed electrodes 5ya and 5yb form a differential structure having a vertically symmetric correlation where one of the capacitances increases while the other decreases.

In a Z direction of the acceleration sensor 1, however, due to the presence of the weight 7 formed on a lower surface of the movable electrode 4, an asymmetric structure is formed only by a capacitance Cz between the movable electrode 4 and the Z-axis fixed electrode 9 facing the movable electrode 4 from above.

When an acceleration is applied to the acceleration sensor 1, the movable electrode 4 supporting the weight 7 moves in the XYZ direction in accordance with the direction of this acceleration. Consequently, the capacitances Cxa and Cxb in the X-axis direction, the capacitances Cya and Cyb of the Y-axis direction, and the capacitance Cz in the Z-axis direction change. The acceleration applied can be measured using the changes in these capacitances.

Figure 2:
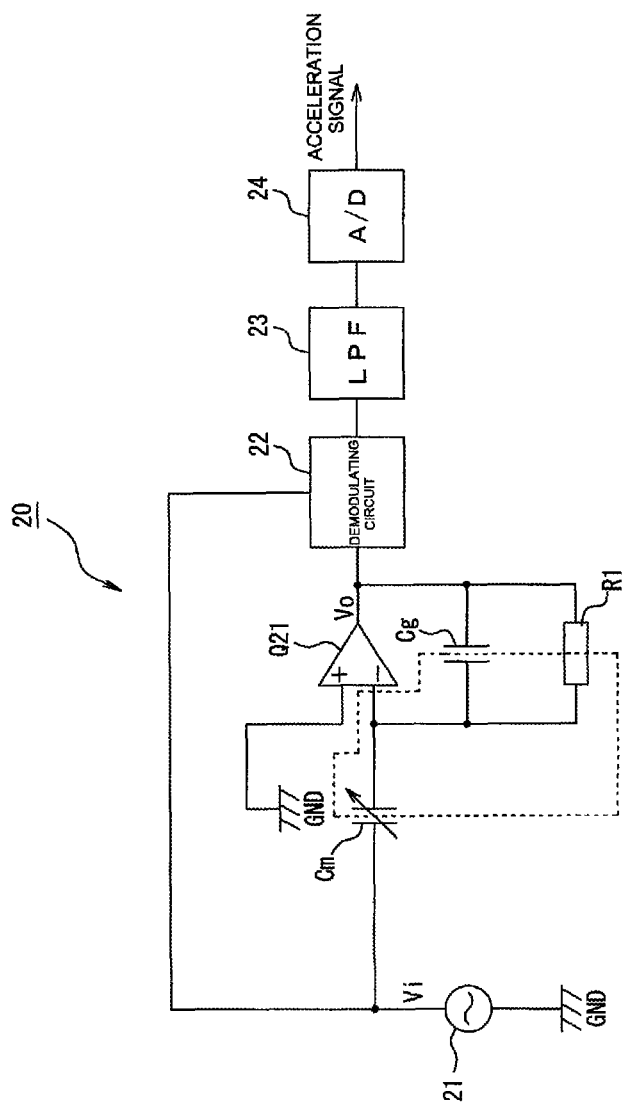
FIG. 2 is a circuit diagram showing a capacitance detection circuit.

In the asymmetric structure along the Z-axis direction, capacitances can be detected by a capacitance detection circuit 20 shown in FIG. 2.

In other words, the capacitance Cz between the movable electrode 4 and the Z-axis fixed electrode 9 is represented as a variable capacitance Cm.

One of the electrodes of the variable capacitance Cm is connected to a carrier signal generating circuit 21 to supply a carrier signal. A carrier signal described here is an AC waveform, such as a sine wave or square wave, having a frequency higher than that of the acceleration to be measured. Such a carrier signal is required for the purpose of detecting a capacitance from a low frequency of or approximately 0 Hz.

The other electrode of the variable capacitance Cm is connected to an inverting input terminal of an operational amplifier Q21, and a non-inverting input terminal of this operational amplifier Q21 is connected to the ground. An output terminal of the operational amplifier Q21 is fed back to the inverting input terminal via a parallel circuit configured by a resistor Rg and a capacitor Cg.

An output voltage Vo output from the output terminal of the operational amplifier Q21 is expressed as follows;

$$Vo=-(Cm/Cg)Vi \quad (1)$$

where Vi represents an output voltage of the carrier signal as an input voltage.

Therefore, by setting the capacity of the capacitor Cg to be equal the variable capacitance Cm when the acceleration is "0," the output voltage Vo obtained by inverting the input voltage Vi is output from the operational amplifier Q21, when the Z-axis direction acceleration to be applied to the acceleration sensor 1 is zero. When an upward acceleration is applied to the movable electrode 4 and the weight 7 of the acceleration sensor 1, the amplitude of the output voltage Vo becomes greater than the amplitude of the input voltage Vi. While on the other hand, a downward acceleration is applied to the movable electrode 4 and the weight 7 of the acceleration sensor 1, the amplitude of the output voltage Vo becomes smaller than the amplitude of the input voltage Vi.

The output from the operational amplifier Q21 is supplied to a demodulating circuit 22 to which the carrier signal of the carrier signal generating circuit 21 has been input. The demodulating circuit 22 demodulates an output signal that is amplitude-modulated by the carrier signal obtained from the operational amplifier Q21.

The demodulated signal that is output from the demodulating circuit 22 is denoised with a low pass filter 23, which is then converted into a digital signal by an A/D conversion circuit 24 and output as an acceleration signal.

Figure 4:
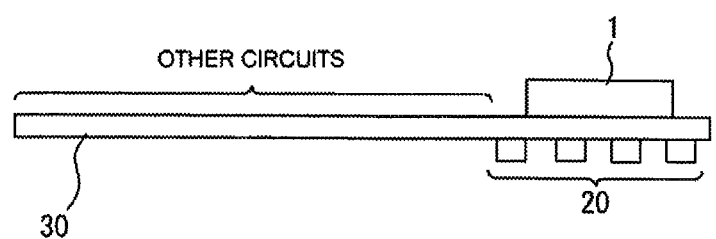
FIG. 4 is a cross-sectional diagram of a printed circuit board.

The acceleration sensor 1 and the capacitance detection circuit 20 are mounted on a printed circuit board 30, as shown in FIG. 4.

Figure 5A:
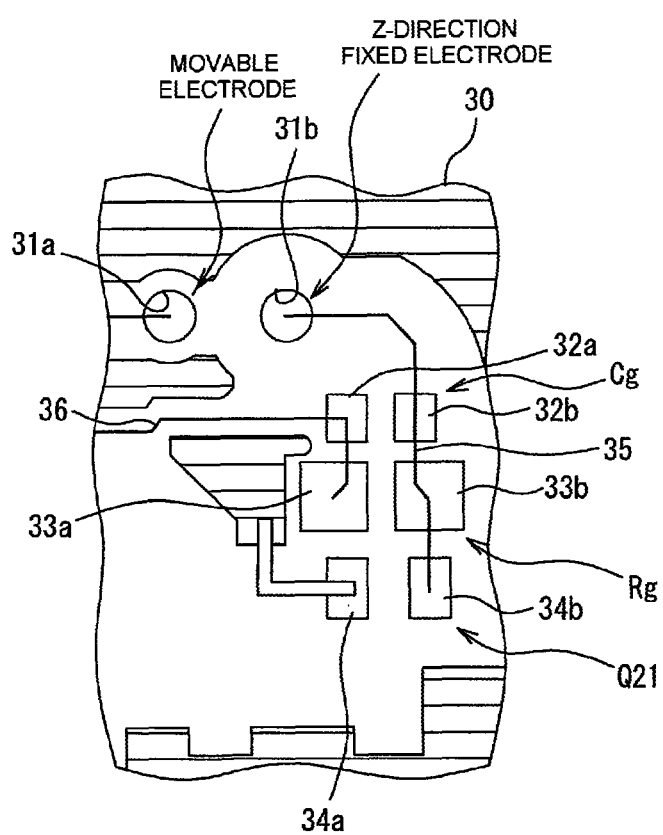
FIGS. 5A and 5B are diagrams showing a resist-applied area and a pattern formation area on the printed circuit board.

Circuit patterns on the printed circuit board 30 for connecting the operational amplifier Q21 and the acceleration sensor 1 are formed as shown in FIG. 5A. In other words, the Z-axis fixed electrode 9 of the acceleration sensor 1 is connected to a through-hole 31b that is a connection part formed on the printed circuit board 30. The movable electrode 4 may be connected via a through-hole 31a.

Connection pads 32a and 32b for individually connecting the electrodes of the capacitor Cg on the output terminal side and on the inverting input terminal side of the operational amplifier Q21 in the capacitance detection circuit 20 are formed to the right front of the through-hole 31b of the printed circuit board 30. Connection pads 33a and 33b for individually connecting the electrodes of the resistor Rg on the output terminal side and on the inverting input terminal side of the operational amplifier Q21 in the capacitance detection circuit 20 are formed in front of the connection pads 32a and 32b. In addition, an input-side connection pad 34a connected to the non-inverting input terminal of the operational amplifier Q21 and an input-side connection pad 34b connected to the inverting input terminal of the operational amplifier Q21 are formed in front of the connection pads 33a and 33b.

The through-hole 31b and the connection pads 32b, 33b and 34b are connected to one another by a wiring pattern 35. The connection pads 32a and 33a are connected to each other by a wiring pattern 36 and to an output pad, not shown, to which the output terminal of the operational amplifier Q21 is connected. In addition, the input-side connection pad 34a is connected to the ground.

Figure 5B:
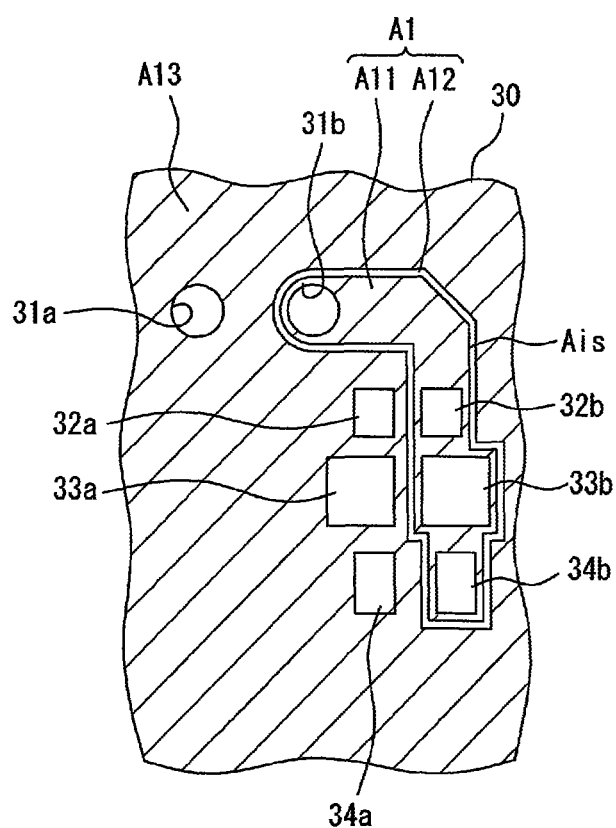

As shown in FIG. 5B, an inverted L-shaped, insulation-secured area Ais surrounding the through-hole 31b and the connection pads 32b, 33b, 34b is formed in a resist-applied pattern of the printed circuit board 30. A moisture absorption reduction area A1 is also formed in such a manner as to surround this insulation-secured area Ais and its surroundings. This moisture absorption reduction area A1 is configured by a resist-applied area A11 applied with a resist to cover the insulation-secured area Ais, and a band-like separation area A12, which is formed as a thin, non-resist-applied area without a resist that surrounds the resist-applied area A11 and as a non-silk-printing area where silk printing is not executed. This moisture absorption reduction area A1 corresponds to the area surrounded by a dotted line in FIG. 2.

On the outside of the band-like separation area A12 is a resist-applied area A13 where a resist is applied and silk printing can be executed.

Operations according to the first embodiment are described below.

Now, when a zero Z-direction acceleration acts on the movable electrode 4 and the weight 7 of the acceleration sensor 1, a carrier signal is output from the variable capacitance Cm and supplied to the operational amplifier Q21.

Therefore, when the Z-direction acceleration to be applied to the movable electrode 4 and the weight 7 of the acceleration sensor 1 is zero, the input signal Vi to be input to the inverting input side of the operational amplifier Q21 is inverted and supplied as the output signal Vo to the demodulating circuit 22 and thereby demodulated. The resultant demodulated signal to be output from the demodulating circuit 22 is denoised with the low pass filter 23, converted into a digital signal by the A/D conversion circuit 24, and then output as an acceleration signal.

When an upward acceleration is applied to the movable electrode 4 and the weight 7 of the acceleration sensor 1, the variable capacitance Cm increases from the state in which the Z-direction acceleration is zero. As a result, the level of the input signal input to the inverting input terminal of the operational amplifier Q21 increases in the positive direction, and the output voltage Vo of the operational amplifier Q21 becomes higher than the input voltage Vi and then inverted. The output of the operational amplifier Q21 is demodulated by the demodulating circuit 22, denoised with the low pass filter 23, converted into a digital value by the A/D conversion circuit 24, and then output as a Z-direction acceleration signal.

While on the other hand, when a downward acceleration is applied to the movable electrode 4 and the weight 7 of the acceleration sensor 1, the variable capacitance Cm decreases from the state in which the Z-direction acceleration is zero, and is then inverted. As a result, the level of the input signal input to the inverting input terminal of the operational amplifier Q21 decreases in the negative direction, and the output voltage Vo of the operational amplifier Q21 becomes lower than the input voltage Vi and then inverted. The output of the operational amplifier Q21 is demodulated by the demodulating circuit 22, denoised with the low pass filter 23, converted into a digital value by the A/D conversion circuit 24, and then output as a Z-direction acceleration signal.

Figure 3:
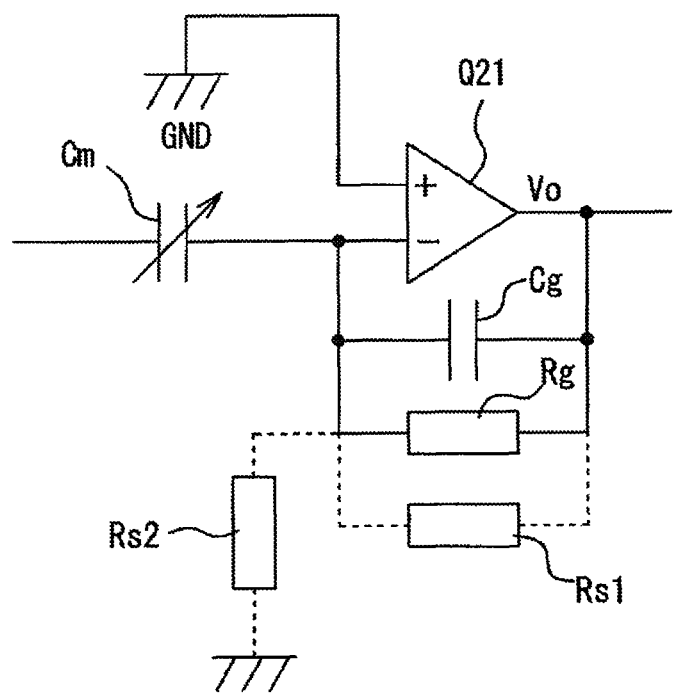
FIG. 3 is an enlarged view of substantial parts shown in FIG. 2.

On the other hand, as shown in FIG. 3 an insulation resistance Rs1 interposed in parallel with a feedback resistor Rg of the operational amplifier Q21, and an insulation resistance Rs2 interposed between the feedback resistor Rg on the inverting input side of the operational amplifier Q21 and the ground, can be considered as an insulation resistance of the printed circuit board 30.

A resistance value of the insulation resistance Rs1 is equal to or greater than 1 GΩ, which is an ideal insulation resistance value when the insulation resistance Rs1 is in a normal state. However, as the insulation resistance progressively deteriorates due to moisture absorption, the resistance value of the insulation resistance Rs1 drops to 100 MΩ or 10 MΩ.

Figure 6:
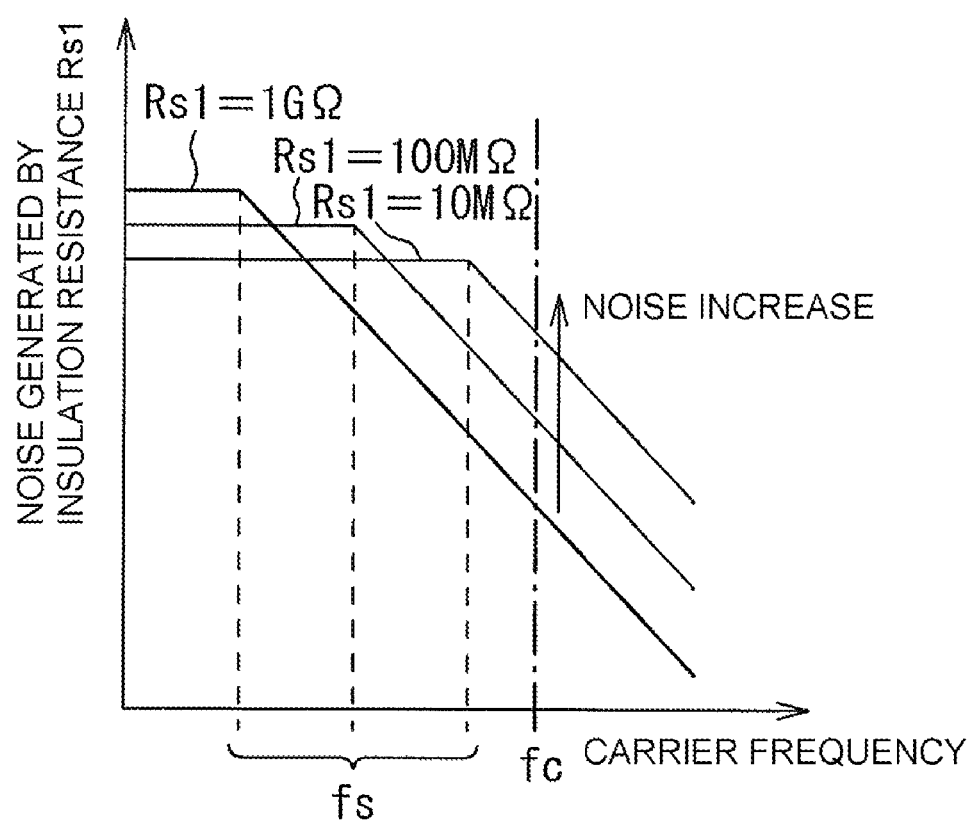
FIG. 6 is a characteristic graph showing the relationship between a carrier frequency and noise generated due to an insulation resistance.

When the resistance value of the insulation resistance Rs1 is equal to or greater than the ideal insulation resistance value of 1 GΩ, noise generated by the insulation resistance Rs1 increases in a low-frequency area, as shown in FIG. 6. However, when the frequency exceeds a relatively low frequency fs represented by $1/2\pi(Cg(Rg \times Rs1/(Rg+Rs1)))$, the amount of noise decreases along a linear characteristic line in response to the increase of the frequency. When the frequency is equal to a carrier frequency fc demodulated by the demodulating circuit 22, the amount of noise drops significantly.

Note that the resist that is applied to the entire surface of the printed circuit board 30 is configured to be slightly hygroscopic in order to protect the wiring patterns from rusting or being corrosive. The resist is also configured to be slightly hygroscopic in case of executing silk printing.

Due to the high hygroscopicity of the resist-applied areas and silk-printing area, insulation deterioration occurs therein over time. Such insulation deterioration and, for example, reduction of the insulation resistance Rs1 to 100 MΩ result in the amount of noise in the low-frequency area lower than the amount of noise generated when the insulation state of the resistance is an ideal state, and the frequency fs represented by $1/2\pi(Cg(Rg \times Rs1/(Rg+Rs1)))$ at which the amount of noise begins to drop becomes higher than that obtained in the ideal state. For this reason, the amount of noise decreases as the frequency increases, at the same inclination as the noise changing during the ideal insulation state. Thus, at the carrier frequency fc, when the insulation resistance Rs1 is 100 MΩ, the amount of noise increases more than during the ideal state, as shown in FIG. 6.

Once the insulation resistance Rs1 decreases to 10 MΩ as the deterioration of the insulation resistance progresses, the amount of noise obtained at the carrier frequency fc further increases and becomes higher than that obtained when the resistance value of the insulation resistance Rs1 is 100 MΩ, as shown in FIG. 6.

Due to the increase in noise generated by the insulation resistance Rs1 at the carrier frequency during demodulation by the demodulating circuit 22, a correct capacitance cannot be detected.

Especially in a case where the acceleration sensor 1 is configured using the SOI substrate 2, the variable capacitance Cm becomes as small as 1 aF to 100 aF; thus, the acceleration sensor becomes susceptible to noise. This makes it difficult to obtain a correct acceleration detection value.

Regarding the insulation resistance Rs2, on the other hand, a noise gain for an input noise between the non-inverting input terminal and inverting input terminal of the operational amplifier Q21 is expressed as, $1+(Rg \times Rs1/(Rg+Rs1))/Rs2$. Therefore, due to the high hygroscopicity of the resist-applied areas and the silk-printing area, applying a resist over the entire surface of the printed circuit board 30 and executing silk printing on the wiring patterns cause the insulation to deteriorate over time. Consequently, the noise gain is increased by a reduction of the resistance value of the insulation resistance Rs2, increasing noise eventually.

In the present embodiment, however, the moisture absorption reduction area A1 is formed in and around the insulation-secured area Ais that includes the through-hole 31b and the connection pads 32b, 33b and 34b, the through-hole 31b having an input-side circuit component on the input side of the operational amplifier Q21 connected thereto. This moisture absorption reduction area A1 is configured by the resist-applied area A11 that covers the insulation-secured area Ais, and the thin, band-like separation area A12 surrounding the resist-applied area A11. Therefore, the resist-applied area A11 is separated from the resist-applied area A13 therearound by the band-like separation area A12. The high insulation resistance of the band-like separation area A12 can prevent a reduction of the insulation resistance between the resist-applied areas A11 and A13 which is caused by moisture absorption, more effectively than by applying a resist or executing silk printing on the resist-applied areas A11 and A13 to connect these areas. As a result, the insulation resistance can be kept high.

The insulation resistance between the resist-applied areas A11 and A13 corresponds to the insulation resistances Rs1 and Rs2 shown in FIG. 3.

For example, the resistance value of the insulation resistance Rs1 needs to be kept at the ideal insulation resistance value of 1 GΩ or higher. Such a high resistance can be prevented from being reduced by moisture absorption by separating the resist-applied area A11 and the resist-applied area A13 from each other by using the band-like separation area A12 that has a lower hygroscopicity than the resist-applied areas or the silk-printing area. The same is true for the insulation resistance Rs2.

As described above, hygroscopicity can be reduced and deterioration of the insulation resistances Rs1 and Rs2 can be prevented by configuring the moisture absorption reduction area A1 with the insulation-secured area Ais that includes the through-hole 31b and the connection pads 32b, 33b and 34b, the through-hole 31b having the input-side circuit component on the input side of the operational amplifier Q21 connected thereto. Consequently, the amount of noise obtained at the carrier frequency fc can be prevented from being increased by deterioration of the insulation resistance. Thus, capacitances can be detected over a long period of time with a high degree of accuracy, improving reliability of the capacitance detection circuit.

Moreover, coating the surface of the insulation-secured area Ais with the resist to configure a resist-applied area can reliably protect the wiring pattern 35, the through-hole 31b, and the connection pads 32b, 33b and 34b from rusting, while preventing a reduction of the insulation resistances.

A second embodiment of the present invention is described next with reference to FIGS. 7 to 9.

The second embodiment describes a capacitance detection circuit in which the two electrodes of the acceleration sensor 1, the X-direction fixed electrode of the Y-direction fixed electrode, form a differential structure having a correlation where the capacitance of one of the fixed electrodes increases while the capacitance of the other fixed electrode decreases.

Figure 7:
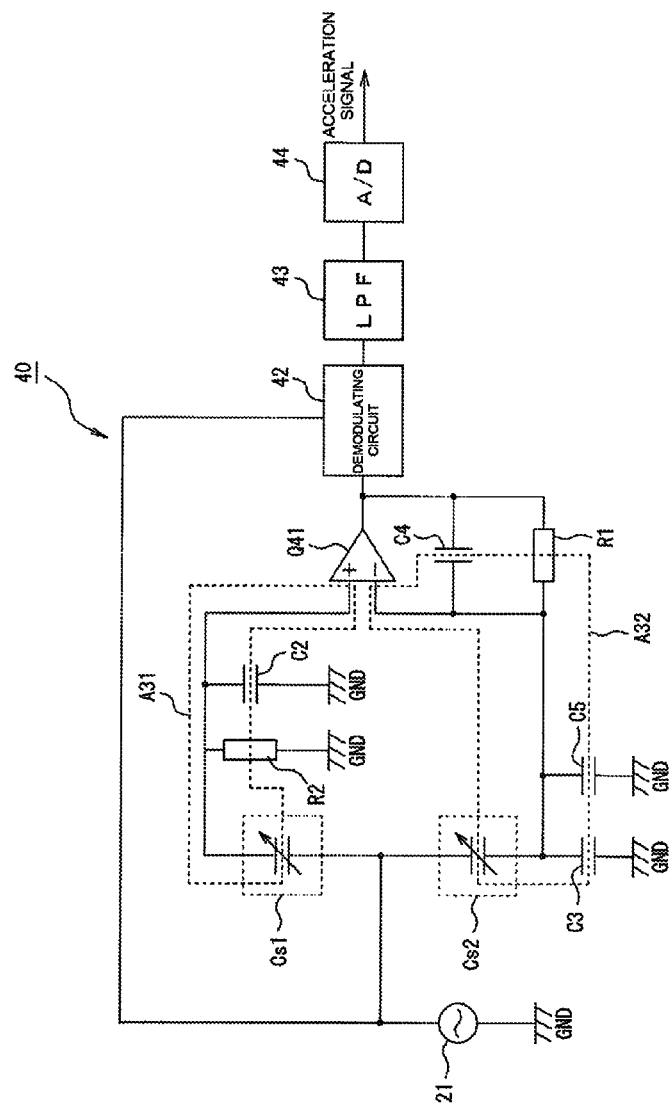
FIG. 7 is a circuit diagram showing a capacitance detection circuit according to a second embodiment of the present invention.

In this capacitance detection circuit 40, as shown in FIG. 7, a capacitance Cxa or Cya between the movable electrode 4 and a fixed electrode 5xa or 6ya of the acceleration sensor 1 is represented as a variable capacitance Cs1, and a capacitance Cxb or Cyb between the movable electrode 4 and a fixed electrode 5xb or 6yb is represented as a variable capacitance Cs2.

One of the electrodes of the variable capacitance Cs1 or Cs2 is connected to the carrier signal generating circuit 21 similar to the one described in the first embodiment, to supply a carrier signal.

Capacitors C2 and C3 with the same capacitance are connected between an electrode of the other variable capacitance Cs1 or Cs2 and the ground, and a resistor R2 is connected in parallel to the capacitor C2. The capacitor C2 is provided for the purpose of swiftly charging the capacitance Cs1 with an electric charger, and the connection of capacitor C3 is implemented to maintain circuit balance. Generally, the capacity of the capacitor C2 is set to be equal to the capacity of the capacitor C3.

The connection point between the variable capacitance Cs1 and the capacitor C2 is connected to a non-inverting input terminal of an operational amplifier Q41 having a constitution of a differential amplifier, and the connection point between the variable capacitance Cs2 and the capacitor C3 is connected to an inverting input terminal of the operational amplifier Q41. An output terminal of the operational amplifier Q41 is fed back to the inverting input terminal via a parallel circuit of a resistor R1 and capacitor C4. In this state, the capacitor C4 determines a gain A1 of the operational amplifier Q41, the gain A1 being expressed as follows:

$$A1 = (Cs1 - Cs2)/C4 \tag{2}$$

The resistors R1 and R2 are used for the purpose of stabilizing a DC potential of the operational amplifier Q41.

This operational amplifier Q41 outputs the difference between the variable capacitances Cs1 and Cs2. For instance, when an acceleration of "0" is applied to the acceleration sensor 1, the weight 7 is displaced by 0, and consequently the variable capacitance Cs1 becomes equal to the variable capacitance Cs2. As a result, the operational amplifier Q41 outputs a zero value.

When the acceleration is not "0," the weight 7 is displaced, and consequently the variable capacitances Cs1 and Cs2 become unequal to each other. As a result, the difference between these variable capacitances is output from the operational amplifier Q41. The greater the acceleration applied to the acceleration sensor 1, the greater the difference between the variable capacitances and therefore the greater the output from the operational amplifier Q41.

The output from the operational amplifier Q41 is supplied to a demodulating circuit 42 to which a carrier signal of the carrier signal generating circuit 21 has been input. The demodulating circuit 42 demodulates an output signal that is amplitude-modulated by the carrier signal obtained from the operational amplifier Q41.

The demodulated signal that is output from the demodulating circuit 42 is denoised with a low pass filter 43, which is then converted into a digital signal by an A/D conversion circuit 44 and output as an acceleration signal.

In the second embodiment as well, the acceleration sensor 1 and the capacitance detection circuit 40 are mounted on the printed circuit board 30, as shown in FIG. 4.

Figure 8:
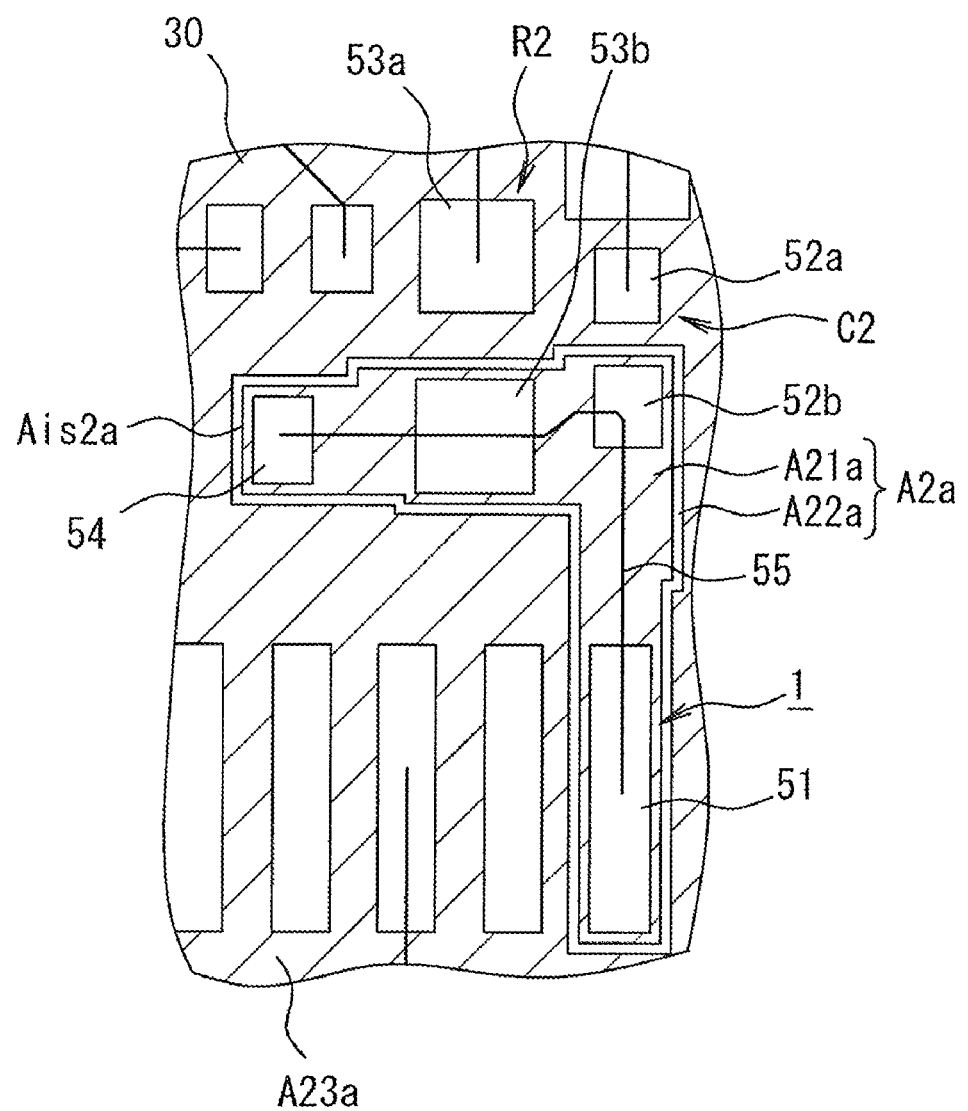
FIG. 8 is a diagram showing a resist-applied area on a printed board according to the second embodiment.

An electrode connection pad 51 to which, for example, the fixed electrode 5xa or 6ya of the acceleration sensor 1 is connected is formed, as shown in FIG. 8, in a circuit pattern of an input circuit portion between the variable capacitance Cs1 and the non-inverting input terminal of the operational amplifier Q41. Further, connection pads 52a and 52b, to which are individually connected the electrode of a capacitor C2 connected to the non-inverting input terminal of the operational amplifier Q41 and the electrode connected to the ground, are formed behind the electrode connection pad 51.

Connection pads 53a and 53b, to which are individually connected the resistor R2 on the output terminal side of the operational amplifier Q41 and on the non-inverting input terminal side of the operational amplifier Q41, are formed to the left of the connection pads 52a and 52b in the printed circuit board 30. In addition, an input-side connection pad 54 to which the non-inverting input terminal of the operational amplifier Q41 is connected is formed to the left of the connection pad 53b in the printed circuit board 30.

The electrode connection pad 51, the connection pads 52b, 53b, and the input-side connection pad 54 are connected to one another by a wiring pattern 55.

The resist-applied pattern of the printed circuit board 30, on the other hand, has a moisture absorption reduction area A2a that covers an inverted L-shaped insulation-secured area Ais2a surrounding the electrode connection pad 51, the connection pads 52b, 53b, and the input-side connection pad 54, as shown by the hatched area in FIG. 8. As with the configuration described in the first embodiment, the moisture absorption reduction area A2a is configured by a resist-applied area A21a applying a resist to the surface of the insulation-secured area Ais2a, and a band-like separation area A22a, which is formed as a thin, non-resist-applied area without a resist that surrounds the resist-applied area A21a and as a non-silk-printing area where silk printing is not executed.

This moisture absorption reduction area A2a corresponds to an area A31 surrounded by a dotted line shown in FIG. 7.

Figure 9:
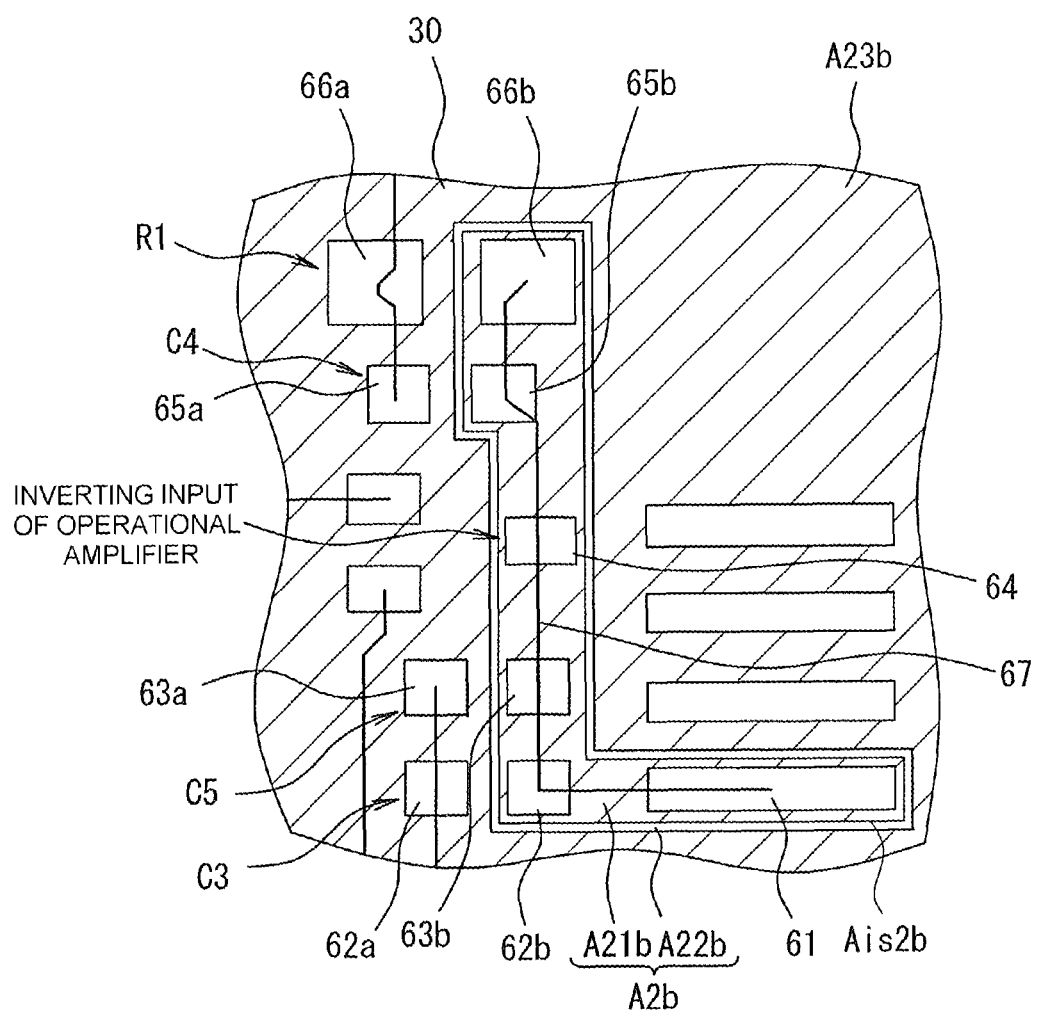
FIG. 9 is a diagram showing another resist-applied area on the printed board according to the second embodiment.

An electrode connection pad 61 to which is connected, for example, the fixed electrode 5xb or 6yb of the acceleration sensor 1 is formed in a circuit pattern of an input circuit portion between the variable capacitance Cs2 and the inverting input terminal of the operational amplifier Q41, as shown in FIG. 9. Also, connection pads 62b and 62a, to which are individually connected the electrode of a capacitor C3 connected to the inverting input terminal of the operational amplifier Q41 and the electrode connected to the ground, are formed to the left of the electrode connection pad 61.

Connection pads 63b and 63a, to which are individually connected the electrode of a capacitor C5 connected to the inverting input terminal of the operational amplifier Q41 and the electrode connected to the ground, are formed behind the connection pads 62a and 62b in the printed circuit board 30. In addition, an input-side connection pad 64 to which the inverting input terminal of the operational amplifier Q41 is connected is formed behind the connection pads 63a and 63b in the printed circuit board 30.

Also, connection pads 65a and 65b, to which are individually connected the electrode of a capacitor C4 connected to the output terminal of the operational amplifier Q41 and the electrode of the same connected to the inverting input terminal of the operational amplifier, are formed behind the input-side connection pad 64 in the printed circuit board 30. Moreover, connection pads 66a and 66b, to which are individually connected the resistor R1 on the output terminal side of the operational amplifier Q41 and on the inverting input terminal side of the operational amplifier Q41, are formed behind the connection pads 65a and 65b in the printed circuit board 30.

The electrode connection pad 61, the connection pads 62b, 63b, the input-side connection pad 64, and the connection pads 65b and 66b are connected to one another by a wiring pattern 67.

The resist-applied pattern of the printed circuit board 30, on the other hand, is configured by, as shown by the hatched area in FIG. 9, a resist-applied area A21b that applies a resist to an L-shaped insulation-secured area Ais2b surrounding the electrode connection pad 61, the connection pads 62b, 63b, the input-side connection pad 64, and the connection pads 65b, 66b, and a band-like separation area A22b, which is formed as a non-resist-applied area that separates the resist-applied area A21b from a resist-applied area A23b therearound and does not apply a resist thereto, and as a non-silk-printing area where silk printing is not executed. This moisture absorption reduction area A2b corresponds to an area A32 surrounded by a dotted line shown in FIG. 7.

According to the second embodiment, the variable capacitance Cs1 is equal to the variable capacitance Cs2 when the X-direction (or Y-direction) acceleration is not applied to the acceleration sensor 1. Thus, the output of the operational amplifier Q41 becomes zero.

When, however, an X-direction rightward (or Y-direction forward) acceleration is applied to the acceleration sensor 1, the variable capacitance Cs1 becomes greater than the value obtained when the acceleration is zero, whereas the variable capacitance Cs2 becomes lower than the value obtained when the acceleration is zero. Consequently, a positive differential output is output from the operational amplifier Q41, which is then demodulated by a demodulating circuit 42, denoised with a low pass filter 43, converted into a digital value by an A/D conversion circuit 44, and output as an acceleration signal.

When, on the other hand, an X-direction leftward (or Y-direction rearward) acceleration is applied to the acceleration sensor 1, the variable capacitance Cs1 becomes smaller than the value obtained when the acceleration is zero, whereas the variable capacitance Cs2 becomes greater than the value obtained when the acceleration is zero. Consequently, a negative differential output is output from the operational amplifier Q41, which is then demodulated by the demodulating circuit 42, denoised with the low pass filter 43, converted into a digital value by the A/D conversion circuit 44, and output as an acceleration signal.

In this manner, a highly accurate acceleration signal corresponding to the acceleration applied to the acceleration sensor 1 can be obtained from the capacitance detection circuit 40.

In the second embodiment as well, the moisture absorption reduction area A2a is formed in such a manner as to surround the insulation-secured area Ais2a that includes the connection pads 51, 52b, 53b and 54 connected between the fixed electrode 5xa or 6ya of the acceleration sensor 1 and the non-inverting input terminal of the operational amplifier Q41. Further, the moisture absorption reduction area A2b is formed in such a manner as to surround the insulation-secured area Ais2b that includes the connection pads 61, 62b, 63b, 64, 65b and 66b connected between the fixed electrode 5xb or 6yb of the acceleration sensor 1 and the inverting input terminal of the operational amplifier Q41.

Because the band-like separation areas A22a and A22b of these moisture absorption reduction areas A2a and A2b are the non-resist-applied area and non-silk-printing area, the resist-applied areas A21a and A21b can be made independent from the surrounding resist-applied areas A23a and A23b.

Consequently, deterioration of the insulation resistances Rs1 and Rs2 can be prevented. By preventing an increase in the amount of noise caused due to deterioration of the insulation resistances, the amount of noise being obtained at the carrier frequency fc, capacitances can be detected over a long period of time with a high degree of accuracy, improving the reliability of the capacitance detection circuit.

In the second embodiment as well, covering the insulation-secured areas Ais2a and Ais2b with the resist-applied areas A21a and A21b can prevent the pads from rusting, while preventing a reduction of the insulation resistances.

Figure 10:
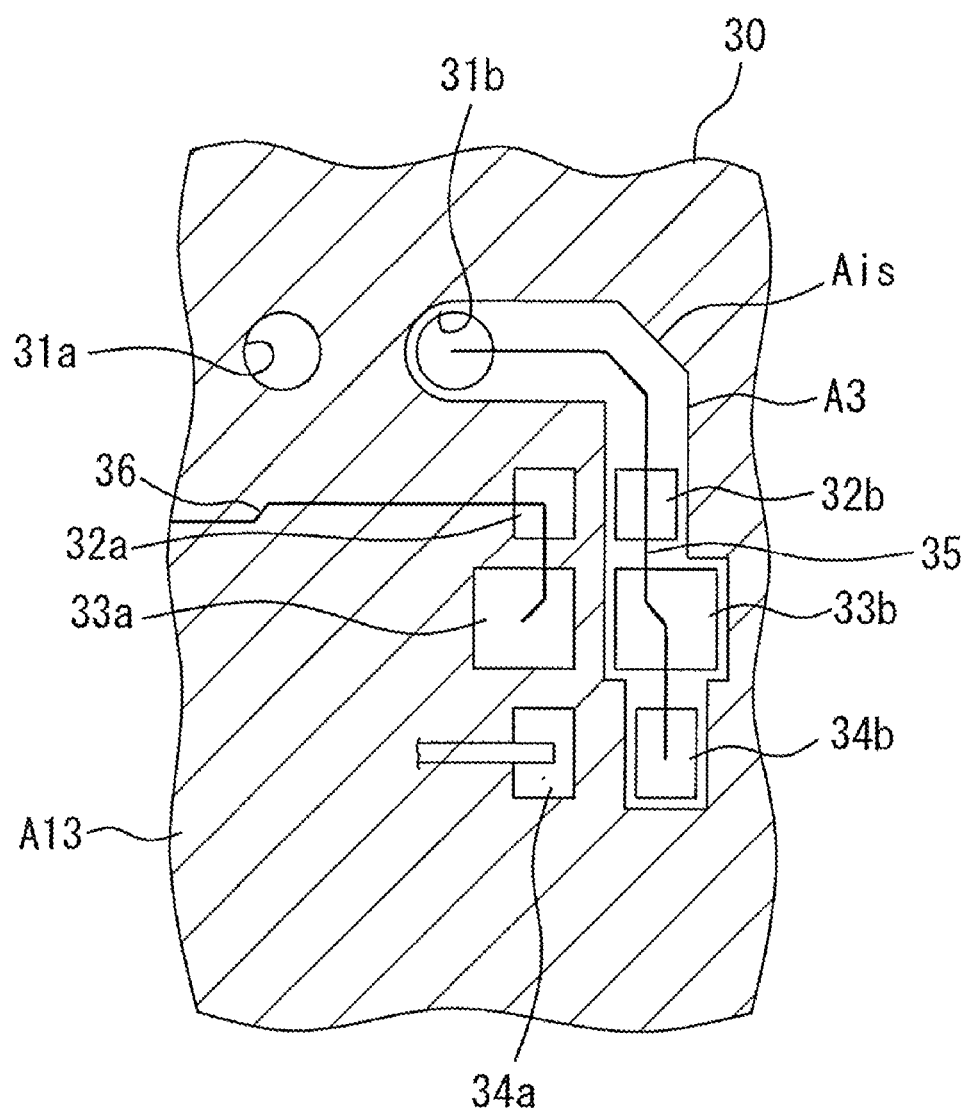
FIG. 10 is a diagram corresponding to FIG. 5B, showing another example of a moisture absorption reduction area on the printed board.
Figure 11:
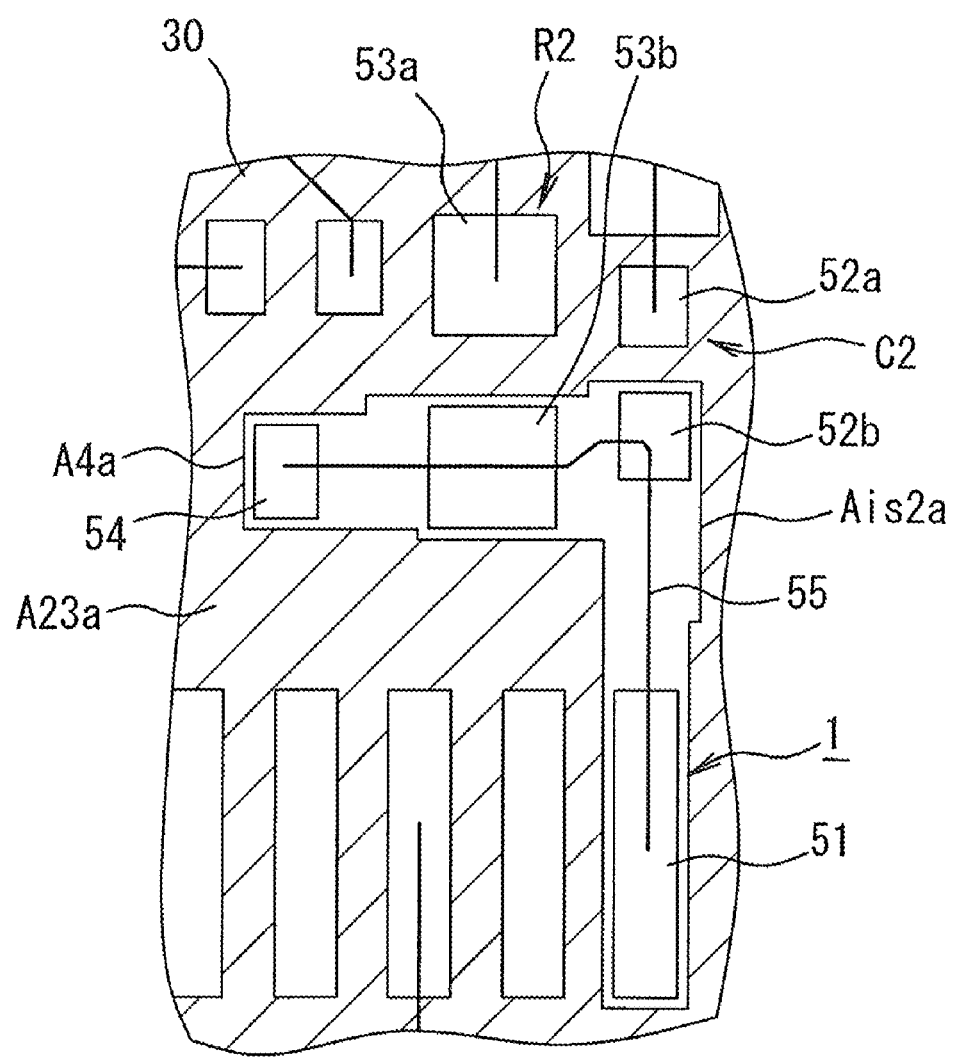
FIG. 11 is a diagram corresponding to FIG. 8, showing another example of the moisture absorption reduction area on the printed board.
Figure 12:
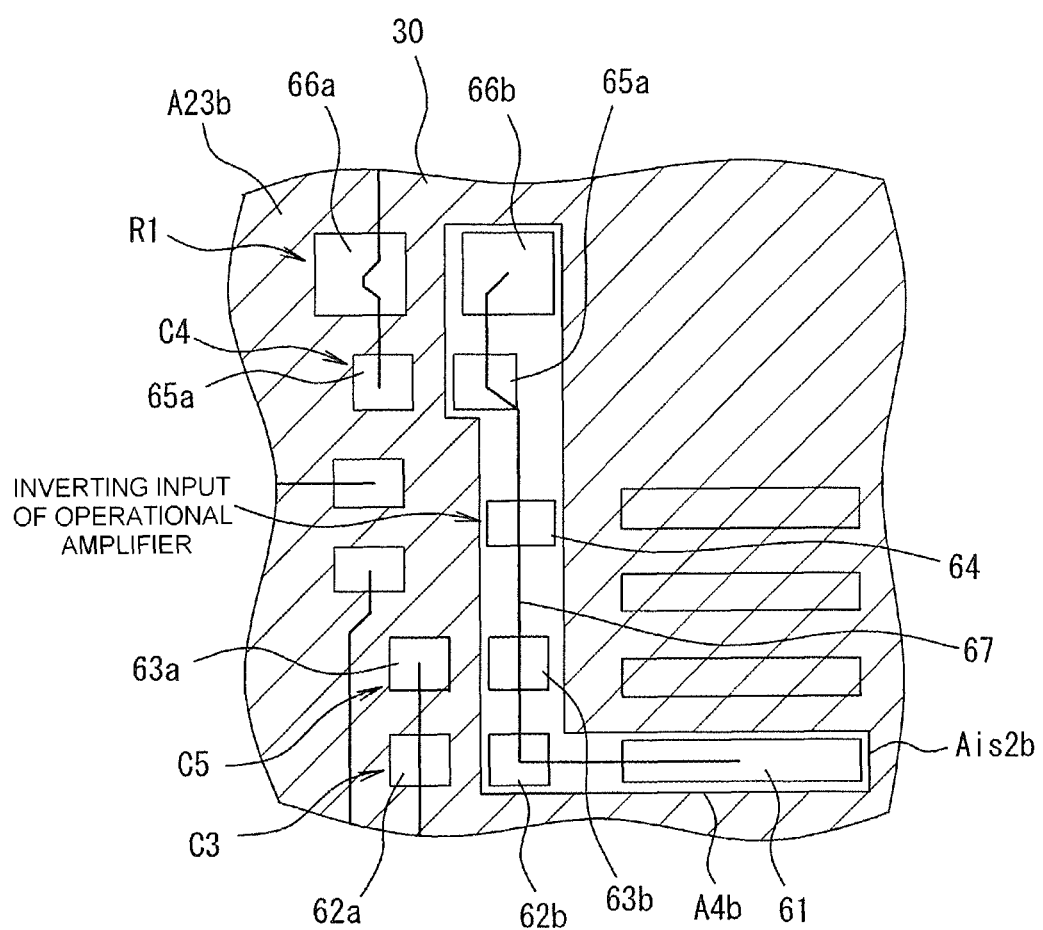
FIG. 12 is a diagram corresponding to FIG. 9, showing another example of the moisture absorption reduction area on the printed board.

The first and second embodiments have described that the moisture absorption reduction areas A1, A2a and A2b are configured by the resist-applied areas A11, A21a and A21b and the band-like separation areas A12, A22a and A22b. However, the invention of the present application is not limited to this configuration. In other words, without utilizing the resist-applied areas A11, A21a and A21b and the band-like insulation-secured areas A12, A22a and A22b, the insulation-secured areas Ais, Ais2a and Ais2b instead may be configured as moisture absorption reduction areas A3, A4a and A4b which are the non-resist-applied areas where no resist is applied and non-screen-printing areas, as shown in FIGS. 10, 11 and 12. In this case as well, decrease in insulation resistance caused by moisture absorption can reliably be prevented by configuring all of the insulation-secured areas Ais, Ais2a and Ais2b as the moisture absorption reduction areas A3, A4a and A4b. Consequently, the insulation resistances Rs1 and Rs2 can be prevented from deteriorating. By preventing an increase in the amount of noise caused due to deterioration of the insulation resistances, the amount of noise being obtained at the carrier frequency fc, capacitances can be detected over a long period of time with a high degree of accuracy, improving the reliability of the capacitance detection circuit.

The first and second embodiments have described the application of the capacitance detection circuits 20 and 40 respectively; however, the present invention is not limited to the configurations of the capacitance detection circuits 20 and 40. Thus, a configuration other than these configurations can be applied as long as it can detect small capacitances.

The first and second embodiments have also described the application of the present invention to an acceleration sensor functioning as a physical quantity sensor; however, the present invention is not limited to such application. The present invention can be applied to a gyroscope, a displacement sensor, a pressure sensor, and various other sensors for detecting a capacitance and a physical quantity.

Furthermore, the first and second embodiments have described the application of the carrier signal generating circuit 21 functioning as a bias voltage generating circuit; however, the present invention is not limited to such application, and can be applied to a vibration measuring device for a motor or the like, which measures vibration as a physical quantity. In such a vibration measuring device, a vibration sensor having the same configuration as the acceleration sensor shown in FIGS. 1A and 1B of the first embodiment is used and a capacitance detection circuit 70 shown in FIG. 13 detects a change in capacitance between a movable terminal and a Z-axis direction terminal of this vibration sensor.

In the configuration of FIG. 2 according to the first embodiment, the capacitance detection circuit 70 employs a DC bias voltage generating circuit 71 in place of the carrier signal generating circuit 21 to generate a DC bias voltage, omits the demodulating circuit 42, and connects the output terminal of the operational amplifier Q21 directly to the low pass filter 23. This DC bias voltage generating circuit 71 is connected to an electrode on the side opposite to the movable electrode 4 or Z-axis fixed electrode 9 configuring the variable capacitance Cm, the electrodes being located on the inverting input side of the operational amplifier Q21. The rest of the configuration is the same as that described in the first embodiment. Therefore, the same reference numerals are applied to the parts corresponding to those shown in FIG. 2, and the detailed descriptions there of are omitted accordingly.

In this case, the vibration sensor is installed in a vibration source to be measured, such as a motor, and vibration from the vibration source to be measured is input to the vibration sensor. Therefore, when measuring vibration, the capacity between the movable electrode 4 and the Z-axis fixed electrode 9 changes due to the vibration from the vibration source to be measured.

Figure 14:
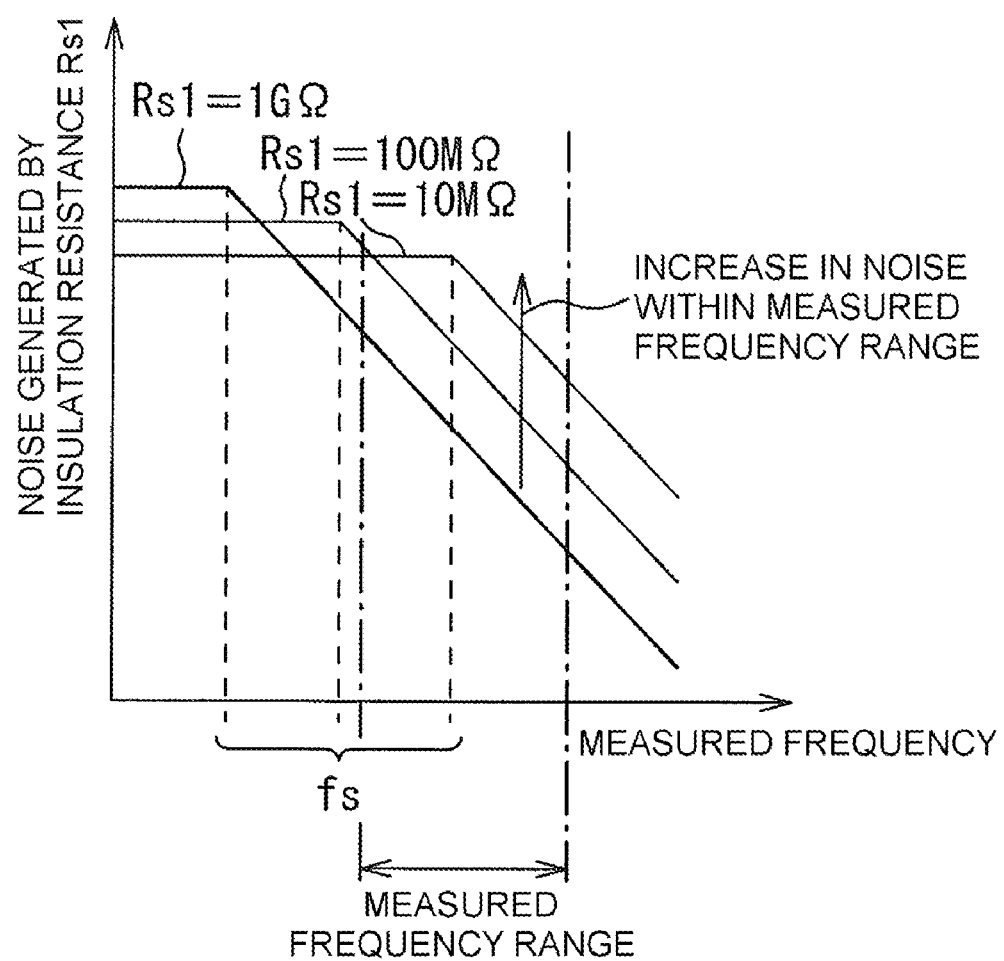
FIG. 14 is a characteristic graph showing the relationship between a measured frequency and noise generated due to an insulation resistance.

Thus, as shown in FIG. 14, the relationship between the frequency of the measured vibration of the vibration source and noise generated by the insulation resistance Rs1 has the same characteristics as the relationship between the frequency of the carrier signal shown in FIG. 6 according to the first embodiment and the insulation resistance Rs1.

When the range of the frequency of the vibration to be measured, or the measured frequency range, corresponds to a high frequency range shown by the chain lines in FIG. 14, the noise increases as the insulation resistance Rs1 decreases.

In this case, the high frequency range needs to be higher than the frequency at which the noise starts decreasing along the characteristic line, the frequency being defined by a relatively low frequency fs represented by $\frac{1}{2\pi}(Cg(Rg \times Rs1/(Rg+Rs1)))$. Therefore, a decrease in the insulation resistance Rs1 generates two problems: (1) the noise within a measurement range increases, and (2) the frequency band between fmin and fs cannot be measured when fmin<fs is established where fmin represents the minimum frequency within the measurement range.

Figure 13:
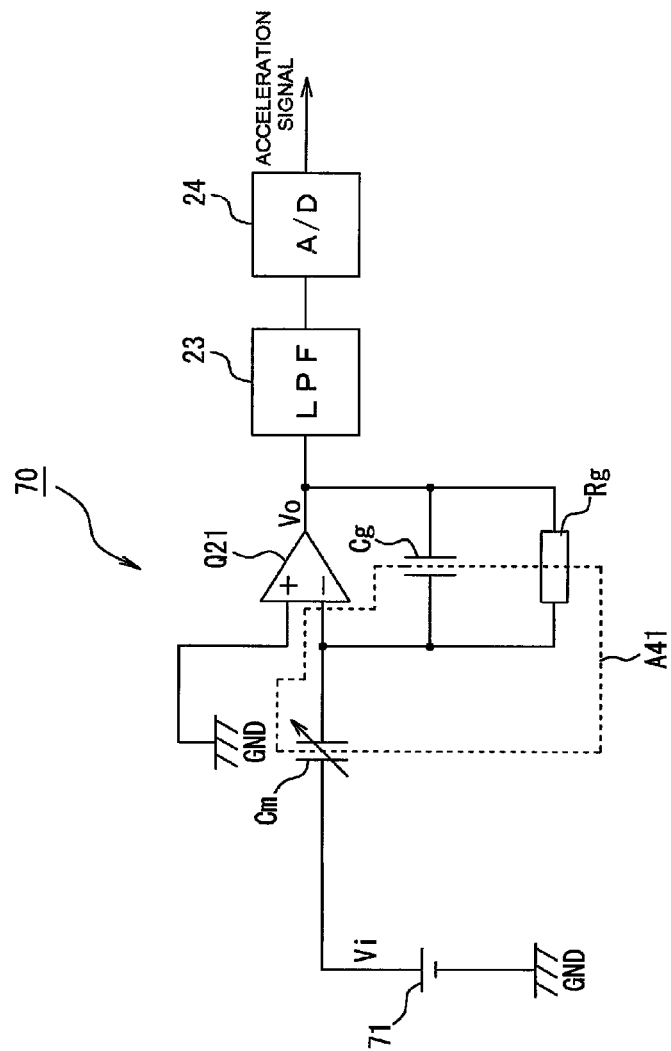
FIG. 13 is a circuit diagram showing another example of the capacitance detection circuit of the present invention.

As with the case described in the first embodiment, the moisture absorption reduction area A1 is formed in such a manner as to surround the insulation-secured area Ais corresponding to the area A41 surrounded by a dotted line in FIG. 13 and its surroundings, the insulation-secured area Ais being configured as an inverted L-shaped area surrounding the through-hole 31b and the connection pads 32b, 33b and 34b of the printed board 30 shown in FIG. 5B. As shown in FIG. 5B this moisture absorption reduction area A1 is configured by the resist-applied area A11 applied with a resist to cover the insulation-secured area Ais, and the band-like separation area A12, which is a thin, non-resist-applied area without a resist that surrounds the resist-applied area A11 and is a non-silk-printing area where silk printing is not executed.

The formation of the moisture absorption reduction area A1 in such a manner as to surround the insulation-secured area Ais can prevent not only a decrease in the insulation resistance of the insulation-secured area Ais caused by moisture absorption, but also an increase in the amount of noise caused in the measured frequency range, the increase in the amount of noise being caused due to deterioration of the insulation resistance. Therefore, capacitances can be detected over a long period of time with a high degree of accuracy, improving the reliability of the capacitance detection circuit.

Moreover, coating the surface of the insulation-secured area Ais with the resist to configure a resist-applied area can reliably protect the wiring pattern 35, the through-hole 31b, and the pads 32b, 33b and 34b from rusting, while preventing a reduction of the insulation resistances.

In this case as well, the entire insulation-secured area Ais can be configured as a moisture absorption reduction area which is a non-resist-applied area and a non-screen-printing area, as shown in FIG. 11.

Figure 15:
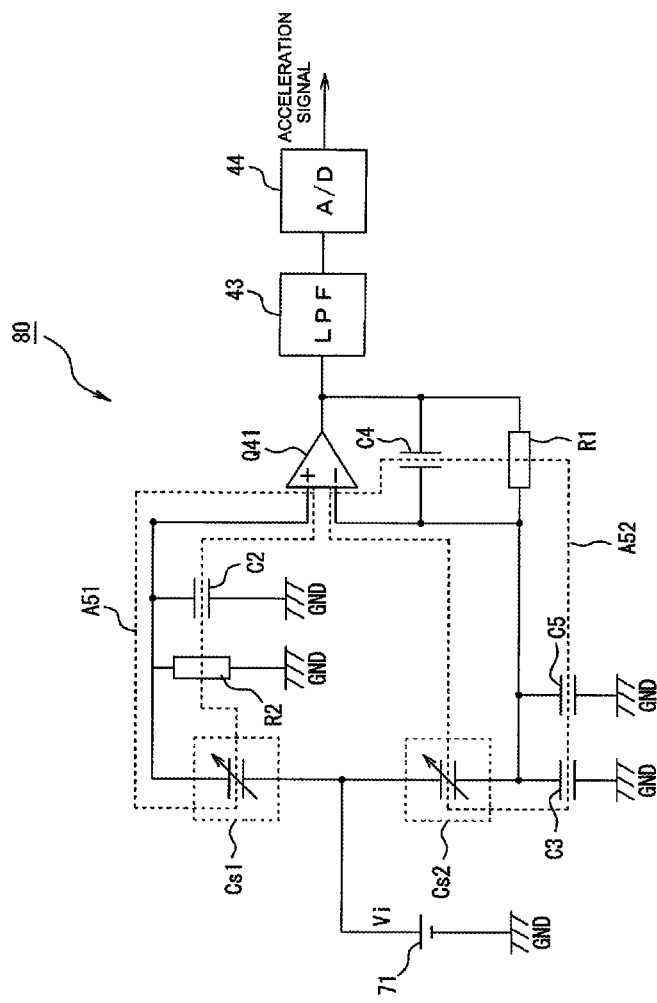
FIG. 15 is a circuit diagram showing yet another example of the capacitance detection circuit of the present invention.

Similarly in a case where vibrations in the XY directions are detected by using a vibration sensor having the configuration shown in FIG. 1, the present invention may employ a capacitance detection circuit 80 that has a DC bias voltage generating circuit 71 in place of the carrier signal generating circuit 21 of FIG. 7 according to the second embodiment, omits the demodulating circuit 42, and has the output terminal of the operational amplifier Q41 connected directly to a low pass filter 43, as shown in FIG. 15. The rest of the configuration of the capacitance detection circuit 80 is the same as that described in the second embodiment. Therefore, the same reference numerals are applied to the parts corresponding to those shown in FIG. 7, and the detailed descriptions there of are omitted accordingly.

In this case, a vibration sensor is installed in a vibration source to be measured, such as a motor, and vibration from the vibration source to be measured is input to the vibration sensor. Therefore, when measuring vibration, the capacities between the movable electrode 4 and the XY-axis fixed electrodes 5xa, 5xb and 6ya, 6yb change due to the vibration from the vibration source to be measured.

Thus, as with the second embodiment, the moisture absorption reduction area A2a is formed in such a manner as to surround the inverted L-shaped insulation-secured area Ais2a surrounding the electrode connection pad 51, the connection pads 52b, 53b, and the input-side connection pad 54 of the printed board 30 shown in FIG. 8, the moisture absorption reduction area A2a corresponding to an area A51 surrounded by a dotted line in FIG. 15.

In addition, the moisture absorption reduction area A2b is formed in such a manner as to cover the L-shaped insulation-secured area Ais2b that surrounds the electrode connection pad 61, the connection pads 62b, 63b, the input-side connection pad 64, and the connection pads 65b, 66b shown in FIG. 9, the moisture absorption reduction area A2b corresponding to an area A52 surrounded by a dotted line in FIG. 15.

The formation of the moisture absorption reduction areas A2a and A2b in such a manner as to surround the insulation-secured areas Ais2a and Ais2b can prevent not only a decrease in the insulation resistances of the insulation-secured areas Ais2a and Ais2b caused by moisture absorption, but also an increase in the amount of noise caused in the measured frequency range, the increase in the amount of noise being caused due to deterioration of the insulation resistances. Therefore, capacitances can be detected over a long period of time with a high degree of accuracy, improving the reliability of the capacitance detection circuit.

Moreover, covering the insulation-secured areas Ais2a and Ais2b with the resist-applied areas A21a and A21b can reliably prevent the pads from rusting, while preventing a reduction of the insulation resistances.

In this case as well, all of the insulation-secured areas Ais2a and Ais2b can be configured as moisture absorption reduction areas which are non-resist-applied areas and non-screen-printing areas, as shown in FIGS. 11 and 12.

INDUSTRIAL APPLICABILITY

The present invention can provide a capacitance detection circuit of a simple structure that is capable of preventing a decrease in insulation resistance and an increase in noise, which are caused due to moisture absorption.

EXPLANATION OF REFERENCE NUMERALS

1 . . . Acceleration sensor, 3 . . . Spring material, 4 . . . Movable electrode, 5xa, 5xb . . . X-axis fixed electrode, 6ya, 6yb . . . Y-axis fixed electrode, 7 . . . Weight, 9 . . . Z-axis fixed electrode, 20 . . . Capacitance detection circuit, 21 . . . Carrier signal generating circuit, Cm . . . Variable capacitance, Cg . . . Capacitor, Rg . . . Resistor, Q21 . . . Operational amplifier, 22 . . . Demodulating circuit, 23 . . . Low pass filter, 24 . . . A/D conversion circuit, 30 . . . Printed circuit board, A1 . . . Moisture absorption reduction area, 40 . . . Capacitance detection circuit, Cs1, Cs2 . . . Variable capacitance, C2, C3, C4, C5 . . . Capacitor, R1, R2 . . . Resistor, Q41 . . . Operational amplifier, 42 . . . Demodulating circuit, 43 . . . Low pass filter, 44 . . . A/D conversion circuit, A2a, A2b . . . Moisture absorption reduction area, 70 . . . Capacitance detection circuit, 71 . . . DC bias voltage generating circuit, 80 . . . Capacitance detection circuit

The invention claimed is:

1. A capacitance detection circuit for detecting a small capacitance between a movable electrode and a fixed electrode in a physical quantity sensor, with the movable electrode and the fixed electrode generating a change in capacitance in response to a change in physical quantity,
the capacitance detection circuit comprising, at least:
a bias voltage generating circuit that generates a bias voltage to be supplied to one of the movable electrode or the fixed electrode;
an operational amplifier that has input terminals, with one of the movable electrode or the fixed electrode being input to one of the input terminals and another one of the input terminals being connected to ground; and
a printed circuit board on which the physical quantity sensor, the bias voltage generating circuit, and the operational amplifier are mounted,
wherein an insulation-secured area on the printed circuit board is configured as a moisture absorption reduction area, the insulation-secured area including at least an electrode connection pad of the physical quantity sensor, an input-side connection pad of the operational amplifier, and connection pads connected to an input side of the operational amplifier, out of connection pads of input-side circuit components connected between the electrode connection pad and the input-side connection pad; and
wherein the moisture absorption reduction area forms a resist-applied area that is applied with a resist to cover the insulation-secured area, and a band-like separation area that surrounds the insulation-secured area in such a manner as to separate the resist-applied area from a resist-applied area therearound, the band-like separation area being configured as a non-resist-applied area and as a non-silk-printing area.

2. The capacitance detection circuit according to claim 1, wherein the input-side circuit components include a resistor and a capacitor connected between an output terminal of the operational amplifier and one of the input terminals thereof.

3. A capacitance detection circuit for detecting a pair of small capacitances between a pair of electrode parts of a physical quantity sensor having a differential structure, each of the pair of electrode parts being configured by a movable electrode and a fixed electrode generating a change in capacitance in response to a change in physical quantity,
the capacitance detection circuit comprising, at least:
a bias voltage generating circuit that generates a bias voltage to be supplied to one of the movable electrode or the fixed electrode of each of the pair of electrode parts;
an operational amplifier that has input terminals and amplifies a difference between the pair of small capacitances, with another one of the movable electrode or fixed electrode of each of the pair of electrode parts being input to one of the input terminals; and
a printed circuit board on which the physical quantity sensor, the bias voltage generating circuit, and the operational amplifier are mounted, wherein
an insulation-secured area on the printed circuit board is configured as a moisture absorption reduction area, including a pair of electrode connection parts of each of the pair of electrode parts that are connected to the operational amplifier, input-side connection parts of the operational amplifier, and connection parts connected to the input-side connection parts of the operational amplifier, out of connection parts of input-side circuit components connected between the electrode connection parts and the input-side connection parts, the moisture absorption reduction area further including a band-like separation area, a first resist-applied area being formed on a first side of the band-like separation area and a second resist-applied area being formed on a second side of the band-like separation area.

4. The capacitance detection circuit according to claim 3, wherein the input-side circuit components include a parallel circuit configured by a first capacitor and a first resistor connected between ground and a connection of one of the pair of electrode parts and one of the input terminals of the operational amplifier, and a second capacitor connected between ground and a connection of another one of the pair of electrode parts and another one of the input terminals of the operational amplifier, and a parallel circuit configured by a third capacitor and a second resistor connected between an output terminal of the operational amplifier and the other one of the input terminals thereof.

5. The capacitance detection circuit according to claim 1, wherein the bias voltage generating circuit generates a carrier signal having an AC waveform.

6. The capacitance detection circuit according to claim 1, wherein the bias voltage generating circuit is configured to generate a DC bias voltage.

7. The capacitance detection circuit according to claim 2, wherein the bias voltage generating circuit generates a carrier signal having an AC waveform.

8. The capacitance detection circuit according to claim 3, wherein the bias voltage generating circuit generates a carrier signal having an AC waveform.

9. The capacitance detection circuit according to claim 1, wherein the bias voltage generating circuit generates a carrier signal having an AC waveform.

10. The capacitance detection circuit according to claim 2, wherein the bias voltage generating circuit is configured to generate a DC bias voltage.

11. The capacitance detection circuit according to claim 3, wherein the bias voltage generating circuit is configured to generate a DC bias voltage.

12. The capacitance detection circuit according to claim 1, wherein the bias voltage generating circuit is configured to generate a DC bias voltage.

13. An apparatus, comprising:
at least a portion of a printed circuit board; and
at least a portion of a capacitance detection circuit mounted to the at least the portion of the printed circuit board;
wherein the at least the portion of the printed circuit board includes
a connection area for connections of components of the at least the portion of the capacitance detection circuit to the at least the portion of the printed circuit board,
the connection area including a separation structure configured to separate at least a portion of the connections of components from a surrounding area;
wherein
at least a portion of the surrounding area is covered with a resist material,
the separation structure includes a band having a lower hygroscopicity than the at least the portion of the surrounding area,
the band forms a perimeter around the at least the portion of the connections of components, and
at least a portion of an area inside the perimeter is covered with a resist material.

14. The apparatus of claim 13, where the at least the portion of the capacitance detection circuit is configured to detect an acceleration based on a change in capacitance.

15. The apparatus of claim 13, wherein a through-hole for the connections of components is formed inside the separation structure.

* * * * *